(12) United States Patent
Murayama et al.

(10) Patent No.: US 8,269,416 B2
(45) Date of Patent: Sep. 18, 2012

(54) FILM WITH TRANSPARENT CONDUCTIVE LAYER, FLEXIBLE FUNCTIONAL ELEMENT AND FLEXIBLE DISPERSION-TYPE ELECTROLUMINESCENT ELEMENT, AND METHOD FOR PRODUCING THE SAME AND ELECTRONIC DEVICE BY THE USE THEREOF

(75) Inventors: Yuki Murayama, Chiba (JP); Masaya Yukinobu, Chiba (JP)

(73) Assignee: Sumitomo Metal Mining Co., Ltd., Tokyo (JP)

( * ) Notice: Subject to any disclaimer, the term of this patent is extended or adjusted under 35 U.S.C. 154(b) by 885 days.

(21) Appl. No.: 11/992,933

(22) PCT Filed: Jun. 26, 2006

(86) PCT No.: PCT/JP2006/312738
§ 371 (c)(1),
(2), (4) Date: Apr. 1, 2008

(87) PCT Pub. No.: WO2007/039969
PCT Pub. Date: Apr. 12, 2007

(65) Prior Publication Data
US 2009/0302756 A1 Dec. 10, 2009

(30) Foreign Application Priority Data

Oct. 5, 2005 (JP) .................................. 2005-291983

(51) Int. Cl.
*H01J 1/62* (2006.01)
*H05K 1/00* (2006.01)
*B32B 29/04* (2006.01)
*B29C 63/02* (2006.01)

(52) U.S. Cl. .......... 313/511; 313/506; 313/507; 427/66; 427/532; 257/40

(58) Field of Classification Search .......... 313/498–512; 315/169.1, 169.3; 428/690–691, 917; 438/26–29, 438/34, 82; 257/40, 72, 98–100; 427/66, 427/532–535, 539
See application file for complete search history.

(56) References Cited

U.S. PATENT DOCUMENTS

| | | | |
|---|---|---|---|
| 6,373,008 B1 | 4/2002 | Saito et al. | |
| 6,605,341 B2 * | 8/2003 | Tamai et al. | 428/212 |
| 6,689,458 B1 * | 2/2004 | Mikoshiba et al. | 428/339 |
| 6,800,166 B2 * | 10/2004 | Kosaka et al. | 156/230 |
| 2001/0008717 A1 | 7/2001 | Iijima | |
| 2002/0012789 A1 | 1/2002 | Iijima | |
| 2002/0045050 A1 * | 4/2002 | Tamai et al. | 428/432 |
| 2003/0118769 A1 * | 6/2003 | Tanaka et al. | 428/40.1 |
| 2005/0052128 A1 * | 3/2005 | Nakanishi | 313/506 |
| 2005/0112361 A1 * | 5/2005 | Tamai et al. | 428/323 |
| 2005/0147745 A1 * | 7/2005 | Iijima | 427/180 |
| 2009/0184637 A1 * | 7/2009 | Yukinobu et al. | 313/509 |
| 2009/0278440 A1 * | 11/2009 | Yukinobu et al. | 313/498 |

FOREIGN PATENT DOCUMENTS

| | | |
|---|---|---|
| EP | 1513164 | 9/2004 |
| JP | 04237909 | 8/1992 |
| JP | 05036314 | 2/1993 |
| JP | 11273874 | 10/1999 |
| JP | 2000108241 | 4/2000 |
| JP | 2001321717 | 11/2001 |
| JP | 2002245858 | 8/2002 |
| JP | 2003217866 | 7/2003 |
| JP | 2004253482 | 9/2004 |

OTHER PUBLICATIONS

English Abstract of JP 04237909.

* cited by examiner

*Primary Examiner* — Tracie Y Green
(74) *Attorney, Agent, or Firm* — Dykema Gossett PLLC (57) ABSTRACT

A compressed multilayered film for a flexible functional element includes a base film, a transparent conductive layer coated on one side of the base film, and a support layer with a low adhesion layer liner on an opposite side of the base film. The support layer is separable from the base film. The base film has a thickness of 3 to 25 μm, and the transparent conductive layer is composed mainly of conductive oxide microparticles and a binder matrix. The multilayered film is compressed to increase the filling density of the conductive microparticles in the transparent conductive layer.

15 Claims, 1 Drawing Sheet

FILM WITH TRANSPARENT CONDUCTIVE LAYER, FLEXIBLE FUNCTIONAL ELEMENT AND FLEXIBLE DISPERSION-TYPE ELECTROLUMINESCENT ELEMENT, AND METHOD FOR PRODUCING THE SAME AND ELECTRONIC DEVICE BY THE USE THEREOF

TECHNICAL FIELD

The present invention relates to a transparent conductive film obtained by forming a transparent conductive layer composed mainly of conductive oxide microparticles and a binder matrix on an ultrathin base film; a flexible functional element which is selected from any of a liquid crystal display element, an organic electroluminescent element and a electronic paper element; a dispersion-type electroluminescent element; wherein these elements are obtained using the film with the transparent conductive layer; and further relates to a method for producing the above-mentioned conductive film and elements, and an electronic device by the use thereof, and particularly relates to a dispersion-type electroluminescent element applied as a luminescent element incorporated in a key input part of various devices such as mobile phones, and to an electronic device by the use of the electroluminescent element.

BACKGROUND ART

In recent years, in various displays including liquid crystal displays and electronic devices such as mobile phones, it has been accelerated to make lighter, thinner and more compact displays and elements. With this trend, researches on replacing glass substrates conventionally used with plastic films are actively performed. The plastic film is light and excellent in flexibility. Thus, if the thin plastic film having a thickness of about several μm can be applied to, for example, a liquid crystal display element, an organic electroluminescent element (hereinafter referred to as an "organic EL element"), an electronic paper element and a dispersion-type electroluminescent element (hereinafter referred to as a "dispersion-type EL element"), it becomes possible to obtain an extremely light and flexible functional element.

Among the above functional elements, the dispersion-type EL element is a luminescent element by driving with alternate current voltage, and has been conventionally used for backlights of the liquid crystal displays in such as mobile phones and remote controllers.

Originally, the luminescent element makes an operation easy in a dark place during the night. Thus, as a new application in recent years, it has been attempted to incorporate the dispersion-type EL element in a key input part (keypad) of various devices such as mobile information terminals such as mobile phones, remote controllers, personal digital assistances (PDA), laptop PCs, and the like.

By the way, light emitting diodes (LED) have been applied as the conventional luminescent element for the above key input part (keypad). However, the dispersion-type EL element has been actively used in place of LED, since there are some issues in LED such that LED is emitted from a point source and a luminance in the keypad portion is uneven and an appearance thereof is poor; that although a white or blue luminescent color is generally popular, such a color requires a high cost in LED; and that LED requires a higher electric power consumption than the dispersion-type EL element.

As a method for producing such a dispersion-type EL element, it has been widely known the method of forming the EL element by sequentially screen-printing a phosphor layer, a dielectric layer and a rear electrode layer on a plastic film (hereinafter referred to as a "sputtering ITO film") having a transparent conductive layer (hereinafter referred to as a "sputtering ITO layer") of an indium tin oxide (hereinafter abbreviated as "ITO"), by generally using a physical film forming method such as sputtering or ion plating.

Here, the above sputtering ITO film is one obtained by forming an ITO single layer which is an inorganic component by the above physical film forming method on a transparent plastic film of polyethylene terephthalate (PET) or polyethylene naphthalate (PEN) so that the thickness is about 20 to 50 nm. Thereby, it becomes possible to obtain the transparent conductive layer having a low surface resistivity of about 100 to 300Ω/□ (ohms per square).

However, there is a problem in the above sputtering ITO layer that microscopic cracks (cracks) easily occur therein since it is a thin film of the inorganic component and extremely fragile. Thus, the plastic film which serves as the substrate is required to have sufficient strength and stiffness, and in an actual condition its thickness is at least 50 μm or more and normally 75 μm or more.

The PET film is widely used for a base film of the above sputtering ITO film, but when its thickness is less than 50 μm, the flexibility of the base film is too high, and the cracks easily occur in the sputtering ITO layer during handling to remarkably impair a conductivity of the film. Thus, it has been the actual circumstance that the thin sputtering ITO film, for example, having the thickness of 25 μm, is not practically used in the device requiring the high flexibility.

In order to further improve the handling, it was also attempted, by using a base film having the thickness of less than 50 μm and lined with a support film having the thickness of about 75 to 125 μm, to form the sputtering ITO film on the base film. In this case, however, the conductivity and the flexibility can not be balanced in the sputtering ITO layer when the support film is delaminated and removed, since the flexibility of the sputtering ITO layer itself is poor.

Also, at present a soft base film, such as a urethane film, is not put to practical use even if its film thickness is 75 μm or more, for the cracks easily occur when the sputtering ITO layer is formed.

By the way, as a property required when the dispersion-type EL element is applied to the above keypad, in addition to the uniform luminance and low electric power consumption as described in Patent Document 1, it becomes important to be excellent in keying durability of the keypad and further click feeling when the keypad is operated.

In particular, in order not to impair the click feeling by incorporating the dispersion-type EL element in the keypad, it is necessary to sufficiently enhance the flexibility of the dispersion-type EL element itself. More specifically, it is necessary to make the thickness of the EL element as thin as possible or use the base film of a flexible material.

However, as described above when the dispersion-type EL element is made using the conventional sputtering ITO film, for preventing the crack in the sputtering ITO layer, it is necessary to make the thickness of the base film at least 50 μm or more to enhance the stiffness. Also the base film of the flexible material can not be used. Thus, when the element is applied to the above keypad, the keying durability is not sufficient yet and the click feeling is not sufficiently good.

Thus, in place of the ITO layer formation by the above sputtering, as the method for forming the relatively flexible transparent conductive layer on the plastic base film as described in Patent Documents 2 to 6, the method in which a coating liquid for forming the transparent conductive layer, composed mainly of conductive oxide microparticles and a binder matrix is applied on the base film and dried, subsequently a compression (rolling) treatment using metal rolls is given, and then a binder component is cured has been known.

This method has an advantage that a filling density of the conductive microparticles in the transparent conductive layer can be increased by the rolling treatment using the metal rolls to widely enhance an electric (conductive) property and an optical property of the film.

However, in the method for forming the transparent conductive layer by these conventional coating methods, in order to obtain the property which is excellent in transparency and conductivity, there is no choice but to set a rolling pressure high. However, in this case, when the thickness of the base film is made thin (e.g., 25 μm or less, particularly 9 μm or less), defects such as a distortion of the base film and an occurrence of the creases tend to occur and as a result, there is such problems that the productivity is reduced and yields of products worsen. Therefore, there has been a limitation in industrial mass production such that in order to prevent them, the base film having the thickness of more than 25 μm (e.g., about 50 μm) is used.

Thus, even in the above method for forming the transparent conductive layer by the conventional coating method, since the base film used is still thick, it has not been possible to sufficiently respond to the flexibility and thinning of the EL element required for the key input parts (keypads).

Also in the flexible functional elements, e.g., the above-mentioned liquid crystal display elements, organic EL elements, electronic paper elements as is the case with the dispersion-type EL element for the above keypad, the film with the transparent conductive layer which is required for producing those flexible functional elements, is formed on the extremely thin base film (plastic film) and is excellent in conductivity, transparency and flexibility has not been obtained.

Patent Document 1: JP 2001-273831-A
Patent Document 2: JP 04-237909-A
Patent Document 3: JP 05-036314-A
Patent Document 4: JP 2001-321717-A
Patent Document 5: JP 2002-36411-A
Patent Document 6: JP 2002-42558-A

DISCLOSURE OF INVENTION

Problem to be Solved by the Invention

The present invention has been made in the light of such a conventional circumstance, and aims at providing a film with a transparent conductive layer and various flexible functional elements such as flexible dispersive EL elements which are more excellent in flexibility than conventional sputtering ITO films and various functional elements such as dispersion-type EL elements using those film; specifically a film with a transparent conductive layer which uses an extremely thin base film and is also good in handling, and a flexible functional element which is selected from any of a liquid crystal display element, an organic EL element, and an electronic paper element as well as a flexible dispersion-type EL element, using the film with the transparent conductive layer, and a method for producing the above-mentioned conductive film and elements and an electronic device by the use thereof.

Means for Solving Problem

For accomplishing the above objects, the film with the transparent conductive layer provided by the present invention is the film with the transparent conductive layer obtained by forming the transparent conductive layer on the base film by a coating technique, wherein a base film side of the film with the transparent conductive layer is lined with a support film having a low adhesive layer separable at an interface with the base film, the base film has a thickness of 3 to 25 μm, and the transparent conductive layer is composed mainly of conductive oxide microparticles and a binder matrix and a compression treatment is given thereto.

Another film with a transparent conductive layer provided by the present invention is characterized in that a peel strength (force per unit length required for the delamination at a region to be delaminated) between the low adhesive layer and the base film is 1 to 15 g/cm regardless of the presence or absence of a heating treatment step, characterized in that both dimensional change rate (heat shrinkage rate) in a machine direction and a transverse direction of the film with the transparent conductive layer is 0.3% or less, characterized in that the base film has the thickness of 3 to 9 μm, characterized in that the conductive oxide microparticle mainly contains any one or more of indium oxide, tin oxide and zinc oxide, characterized in that the conductive oxide microparticle is an indium tin oxide microparticle, characterized in that the binder matrix is crosslinked and has an organic solvent resistance, and characterized in that the compression treatment is performed by a rolling treatment using metal rolls.

Subsequently, the flexible functional element provided by the present invention is characterized in that the functional element which is selected from any of the liquid crystal display element, the organic electroluminescent element, and the electronic paper element is formed on the transparent conductive layer of the film with the transparent conductive layer and then the support film having the low adhesive layer is delaminated and removed at the interface of the base film and the low adhesive layer.

Furthermore, the flexible dispersion-type electroluminescent element provided by the present invention is characterized in that at least a phosphor layer, a dielectric layer and a rear electrode layer are sequentially formed on the transparent conductive layer of the film with the transparent conductive layer and then the support film having the low adhesive layer is delaminated and removed at the interface of the base film and the low adhesive layer.

Also, the electronic device provided by the present invention is characterized in that the flexible dispersion-type electroluminescent element is applied as the luminescent element incorporated in the key input part of the device, and the electronic device is characterized by being the mobile phone, the remote controller, or the mobile information terminal.

The method for producing the film with the transparent conductive layer according to the present invention is the method for producing the film with the transparent conductive layer obtained by forming the transparent conductive layer on the surface of the base film having a thickness of 3 to 25 μm and lined with the support film having the low adhesive layer separable at the interface with the base film, wherein the transparent conductive layer is formed by forming a coating layer on the side not lined with the support film of the base film using a coating liquid for forming the transparent conductive layer composed mainly of the conductive oxide microparticles and the binder and a solvent, then giving the compression treatment to the base film on which the coating layer is formed and the lining support film, and subsequently curing the coating layer to which the compression treatment is given.

Also, the method for producing another film with the transparent conductive layer according to the present invention is characterized in that the compression treatment is performed by the rolling treatment using the metal rolls, and the rolling treatment is characterized in that a linear pressure is 29.4 to 490 N/mm (30 to 500 kgf/cm).

Subsequently, the method for producing the flexible functional element according to the present invention is characterized in that a functional element which is selected from any of the liquid crystal display element, the organic electroluminescent element, and the electronic paper element is formed on the transparent conductive layer of the film with the transparent conductive layer and then the support film having the low adhesive layer is delaminated and removed at the interface of the base film and the low adhesive layer.

Furthermore, the method for producing the flexible dispersion-type electroluminescent element according to the present invention is characterized in that at least the phosphor layer, the dielectric layer and the rear electrode layer are sequentially formed on the transparent conductive layer of the film with the transparent conductive layer and then the support film having the low-adhesive layer is delaminated and removed at the interface of the base film and the low adhesive layer.

Effect of the Invention

According to the present invention, it is possible to inexpensively provide the film with the transparent conductive layer and various flexible functional elements such as flexible dispersion-type EL elements which are more excellent in flexibility than the conventional sputtering ITO films and various functional elements such as dispersion-type EL elements using those films.

Also when the above flexible dispersion-type EL element is applied to the keypad of the mobile phone, the element has the practically sufficient keying durability, and simultaneously it becomes possible to obtain the good click feeling of the key operation without giving a special structure and contrivance to the keypad.

BEST MODE(S) FOR CARRYING OUT THE INVENTION

First, the flexible functional elements to which the film with the transparent conductive layer of the present invention can be applied include liquid crystal display elements, organic EL elements, electronic paper elements, and dispersion-type EL elements.

The above liquid crystal display element is a non-luminescent type electronic display element widely used for the displays of mobile phones, PDAs, PCs, and like, a simple matrix system and an active matrix system are available, and the active matrix system is more excellent in image quality and response speed. In its basic structure, the display is performed by sandwiching the liquid crystal with transparent electrodes and orienting the liquid crystal molecules by voltage driving, but the actual element is used by further laminating a color filter, a phase contrast film, and a polarization film in addition to the above transparent electrodes.

The above organic EL element is a self-luminescent element differently from the liquid display element and the high luminance is obtained by low voltage driving. Thus, this is expected as a display apparatus such as a display. Its structure is obtained by sequentially forming a positive hole injection layer (hole injection layer) composed of a conductive polymer such as a polythiophene derivative, an organic luminescent layer (a low molecular luminescent layer formed by vapor deposition and a high molecular luminescent layer formed by application), a cathode electrode layer (a metal layer of magnesium [Mg], calcium [Ca] or aluminium [Al] having a good electron injection property to the luminescent layer and a low work function) and a gas barrier coating layer (or a sealing treatment with a metal or a glass) on the transparent conductive layer as an anode electrode layer.

The above electronic paper element is a non-luminescent type electronic display element which does not emit the light by itself, comprises a memory effect that the display remains intact even if an electric power is turned off, and is expected as the display for character representation. Its display system can include an electrophoresis system in which colored particles are migrated in a liquid between the electrodes by electrophoresis, a twist ball system which pigmentizes by rotating the particles having a bicolor property in an electric field, e.g., a liquid crystal system in which the display is performed by sandwiching a cholesteric liquid crystal with transparent electrodes, a powder based system in which the display is performed by migrating colored particles (toner) or electric powder fluids (quick response liquid powder) in air, an electrochromic system in which the color is developed based on an electrochemical oxidation reduction action and an electrodeposition system in which the display is performed by color change depending on precipitation and dissolution of the metal by electrochemical oxidation and reduction.

The dispersion-type EL element is a self-luminescent element which emits the light by applying the strong electric field to the layer containing phosphor particles, and this will be described in detail later.

In all of the above functional elements, it becomes an increasingly important problem to make the element thinner and lighter and impart the flexibility thereto. Thus, if the film with the transparent conductive layer of the present invention is applied, these problems can be solved.

The case of applying the film with the transparent conductive layer of the present invention to the flexible dispersion-type EL element will be described specifically below. But the film with the transparent conductive layer of the present invention can be likewise applied to the above flexible functional elements even if the steps of producing the elements are different.

The invention will be better understood by reference to the attached drawings, taken in conjunction with the following discussion.

DETAILED DESCRIPTION OF THE PREFERRED EMBODIMENTS

Figure 1:
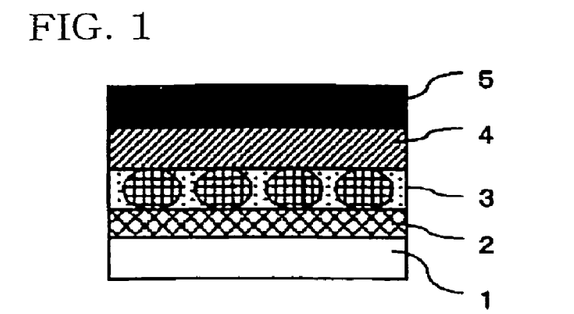
FIG. 1 illustrates the layered construction of a dispersion-type EL element according to the prior art.

As shown in FIG. 1, the conventional dispersion-type EL element has at least a transparent conductive layer 2, a phosphor layer 3, a dielectric layer 4 and a rear electrode layer 5 sequentially formed on a transparent plastic film 1. In the actual application to the device, as shown in FIG. 2, it is common to use by further forming a collector electrode 6 made of silver, etc. and an insulating protection layer 7.

Figure 3:
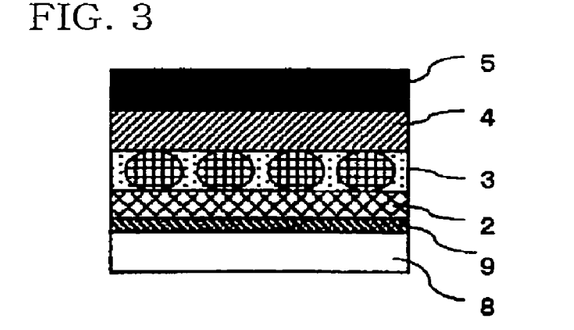
FIG. 3 illustrates the layered construction of a flexible dispersion-type EL element according to the present invention.

Meanwhile, as shown in FIG. 3, the flexible dispersion-type EL element of the present invention has at least the transparent conductive layer 2, the phosphor layer 3, the dielectric layer 4 and the rear electrode layer 5 sequentially formed on the base film 9 lined with the support film 8 having the low adhesive layer. In the actual application to the device, as shown in FIG. 4, the support film having the low adhesive layer is delaminated and removed at the interface between the base film and the low adhesive layer in use.

Although it is not shown in FIG. 3, the low adhesive layer is present between the support film and the base film. As described above, the low adhesive layer is delaminated and removed together with the support film when the support film is delaminated. Although it can not be said to be common, when the material per se of the support film has a low adhesive property, the support film also works as the low adhesive layer. Thus, it is not necessary to particularly form the low adhesive layer on the support film.

Figure 2:
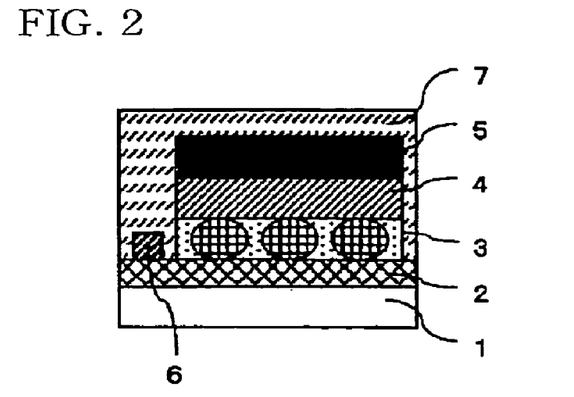
FIG. 2 illustrates the layered construction of the prior art device of FIG. 1 when modified for use.
Figure 4:
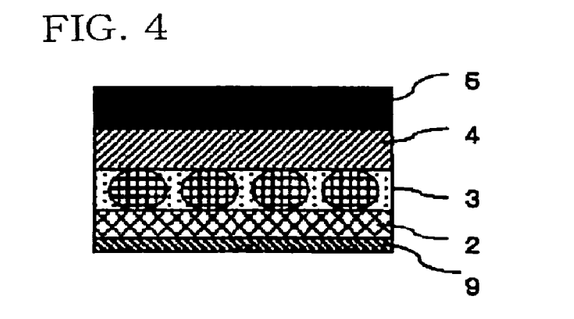
FIG. 4 illustrates the layered construction of the flexible dispersion-type EL element of FIG. 3 when ready for use.

Also although not shown in FIG. 4, as is the case with FIG. 2, it is common to use by further forming the collector electrode made of silver, etc. and the insulating protection layer.

As described above, in the film with the transparent conductive layer and the flexible dispersion-type EL element of the present invention, the base film is lined with the support film. Thus, the thickness of the base film per se can be set thin, and it is also possible to impart the good flexibility to the dispersion-type EL element if the material of the base film is appropriately selected.

Roles of the support film used in the present invention include an action to make the handling easy in the process for producing the flexible dispersion-type EL element of the present invention, an action to prevent curls in the lamination steps of the phosphor layer, the dielectric layer and the rear electrode layer, an action to protect during transport and handling of the film with the transparent conductive layer and the dispersion-type EL element, and an action to evenly perform the printing of the transparent conductive layer, the phosphor layer, the dielectric layer and the rear electrode layer (generally in the screen printing, using a suction stage having many holes with small diameters, and the film is fixed by reducing pressure in the portion of the holes. If the film as the substrate is thin, the film in the portion of the holes is deformed and hollowed due to the reduced pressure and traces of these hollows are left on the film after the screen printing).

Here, the thickness of the support film used in the present invention is 50 μm or more, preferably 75 μm or more and more preferably 100 μm or more. When the thickness of the support film is less than 50 μm, the stiffness of the film is reduced and the problems tend to occur in the handling in the process for producing the above-mentioned dispersion-type EL element, the curl of the substrate, and the printing property of the phosphor layer, the dielectric layer and the rear electrode layer. In the flexible dispersion-type of the present invention, in the final step of the production thereof, a half cut processing is performed in order to delaminate only a predetermined shape of the dispersion-type EL element from the lining support film. If the thickness of the support film is less than 50 μm, the half cut processing can not be performed well. The above half cut processing is the method of cutting only the dispersion-type EL element portion including the base film along an element shape using a mold press in the dispersion-type EL element lined with the support film. Actually, a part of the lining support film is also cut. Thus, the predetermined thickness is required for the support film as described above.

Meanwhile, it is preferable that the thickness of the support film used in the present invention is 200 μm or less. When the thickness exceeds 200 μm, the support film is rigid and heavy, which is difficult to handle and simultaneously is not preferable in cost.

For the support film used in the present invention, no transparency is required, its material is not particularly limited and various plastics can be used. Specifically, the plastics such as polycarbonate (PC), polyethylene terephthalate (PET), polyethylene naphthalate (PEN), nylon, polyether sulfone (PES), polyethylene (PE), polypropylene (PP), urethane, fluorine based resins and polyimide (PI) can be used. Among them, PET films are preferable in terms of being inexpensive, excellent in strength and also having the flexibility.

The support film used in the present invention passes through the process for producing the film with the transparent conductive layer and the dispersion-type EL element while adhering to the base film, and is delaminated finally from the base film. Thus, generally the acrylic or silicone based low adhesive layer is applied and formed on one side. The silicone based low adhesive layer is preferable in terms of excellent heat resistance.

Here, in the low adhesive layer used in the present invention, the peel strength with respect to the base film (force per unit length required for the delamination at the portion to be delaminated in T type peel test [tensile speed=300 mm/min]) is 1 to 15 g/cm, preferably 2 to 10 g/cm and more preferably 2 to 6 g/cm. When the peel strength is less than 1 g/cm, even if the support film adheres to the base film, it is easily delaminated in the process for producing the film with the transparent conductive layer and the dispersion-type EL element. Thus, this is not preferable. When the peel strength is more than 15 g/cm, the support film is difficult to delaminate from the base film. The flexible dispersion-type EL element is hard to delaminate from the support film. Thus, the workability in the step of delaminating the EL element worsens. If the EL element is forcedly delaminated, risks, such as a stretch of the element, deterioration (cracks and the like) of the transparent conductive layer, and adherence of a part of the low adhesive layer to the side of the base film, are likely to occur.

The flexible dispersion-type EL element of the present invention is produced by giving several times of the heating steps (normally about 120 to 140° C.) to the film with the transparent conductive layer as described later. Thus, it is necessary that the above peel strength is kept even after the above heating steps. Therefore, the heat resistance is required for the material of the low adhesive layer. When the film with the transparent conductive layer is produced, the step of curing with ultraviolet light is sometimes applied. In that case, an ultraviolet light resistance is also required for the material of the low adhesive layer.

The thickness of the base film is required to be 3 to 25 μm, and is preferably 3 to 16 μm and more preferably 3 to 9 μm. When the thickness of the base film exceeds 25 μm, its stiffness becomes high, and when such a film is incorporated in the keypad as the flexible dispersion-type EL element, no good click feeling is obtained. When the thickness of the base film is 9 μm or less, this is more preferable because not only the better click feeling is obtained but also the thickness of the dispersion-type EL element per se can be made thinner.

Meanwhile, when the thickness of the base film is less than 3 μm, the common film generally distributed is difficult to obtain, the handling of the base film per se becomes difficult, it becomes difficult to line with support film, and the strength of the base film per se is reduced. Thus damages occur in components of the element including the transparent conductive layer and the phosphor layer of the dispersion-type EL element when such film is incorporated in the key input part of the device. Thus, this is not preferable.

The material of the base film used in the present invention is not particularly limited as long as it adheres to the support film via the low adhesive layer, has a separability and is translucent, and the transparent conductive layer can be formed thereon. Various plastics can be used. Specifically, the plastics such as polyethylene terephthalate (PET), polyethylene naphthalate (PEN), nylon, polyether sulfone (PES), polycarbonate (PC), polyethylene (PE), polypropylene (PP), urethane and fluorine based resins can be used. Among them, the PET films are preferable in terms of being inexpensive, excellent in strength and also having the flexibility.

As the base film, the film reinforced with visible light transmitting inorganic and/or organic (plastic) fibers (including needle, bar, and wisker microparticles), and flake-shaped microparticles (including platy-shapes) may be used. In the base film reinforced with the fibers or the flake-shaped microparticles, even the thinner film can have the good strength.

As described in the above description of the peel strength for the low adhesive layer, the flexible dispersion-type EL element of the present invention is produced by giving several times of the heating treatments to the film with the transparent conductive layer. Thus, it is necessary that both dimensional change rates (thermal shrinkage rates) in the machine direction (MD) and the transverse direction (TD) of the film with the transparent conductive layer is 0.3% or less, preferably 0.15% or less and more preferably 0.1% or less before and after these heating treatments. Here, in the plastic film, the dimensional change rate due to the heating treatment generally indicates the shrinkage rate. For example, in the biaxial stretching PET film, the shrinkage rate in the machine direction (MD) in the heating treatment has a value which is several times larger than that in the transverse direction (TD).

When the dimensional change rate in either the machine direction (MD) or the transverse direction (TD) exceeds 0.3%, the dimensional change (shrinkage) occurs, every time heating curing treatment is applied, to shift the printing in respective lamination processes in which a paste for forming each layer is sequentially pattern-printed, dried and heated/cured to form each layer of the phosphor layer, the dielectric layer and the rear electrode layer on the film with transparent conductive layer. A size of the shift exceeds an allowable limit in the production of the dispersion-type EL element. Thus, this is not preferable.

Therefore, it goes without saying that no dimensional change (dimensional change rate is 0%) in the film with the transparent conductive layer is within the scope of the technical idea of the present invention.

The methods for reducing the above dimensional change rate include, but are not limited to, the method of using a low heat shrinkable type support film or base film previously thermally shrunk, the method of previously thermally shrinking the base film lined with the support film, and the method of thermally shrinking the whole film with the transparent conductive layer. If these methods are appropriately applied, it becomes possible to reduce the dimensional change rate of the film with the transparent conductive layer during the heating treatment process, and simultaneously it is possible to inhibit the curl in the flexible dispersion-type EL element lined with the film with the transparent conductive layer or the support film, due to the difference of the dimensional change rates between the support film and the base film.

Subsequently, the method for producing the film with the transparent conductive layer of the present invention will be described.

The transparent conductive layer composed mainly of the conductive oxide microparticles and the binder matrix can be formed on the above base film according to the formation method described in above-mentioned Patent Documents 2 to 6, as follows.

First, a coating liquid for forming the transparent conductive layer, in which the conductive oxide microparticles are dispersed in a solvent containing a binder component, is applied on the base film lined with the support film and having the thickness of 3 to 25 μm or less, and dried to form a coating layer. Subsequently, the compression treatment is given to this coating layer together with the base film lined with the support film. Then, the binder component in the coating layer to which the compression treatment is given is cured.

When the compression treatment is given, the filling density of the conductive microparticles in the transparent conductive layer is increased. Thus, not only the optical property of the film is enhanced by reducing the light scattering, but also the conductivity can be largely enhanced. As the compression treatment, for example, the base film on which the coating liquid for forming the transparent conductive layer is applied and dried may be rolled by metal rolls plated with hard chromium. For a rolling pressure of the metal rolls in this case, the linear pressure is preferably 29.4 to 490 N/mm (30 to 500 kgf/cm) and more preferably 98 to 294 N/mm (100 to 300 kgf/cm). When the linear pressure is less than 29.4 N/mm (30 kgf/cm), a resistance value of the transparent conductive layer is not sufficiently improved by the rolling treatment. When the linear pressure exceeds 490 N/mm (500 kgf/cm), a rolling equipment grows in size and the base film and the support film are sometimes distorted. The rolling pressure (N/mm$^2$) per unit area of the metal rolls in the rolling treatment is a value obtained by dividing the linear pressure by a nip width (width of a region in the transparent conductive layer collapsed with the metal roll in the contact portion of the metal roll and the transparent conductive layer), and the nip width is about 0.7 to 2 mm if a roll diameter is about 150 mm depending on the metal roll diameter and the linear pressure. In the present invention, since the base film lined with the support film is used, even if the above rolling treatment is given to the extremely thin base film, the occurrence of distortion and crease in the base film can be effectively prevented. Furthermore, in the rolling treatment using the metal rolls plated with hard chromium, by using a mirror rolls where roughness on the metal roll surface is extremely small, it is possible to make the surface of the transparent conductive layer after the above rolling treatment extremely smooth. This is because even when there are protrusions on the coating layer obtained by applying the coating liquid for forming the transparent conductive layer, the protrusions can be flattened physically by the rolling treatment using the metal rolls. When the smoothness on the surface of the transparent conductive layer is good, the occurrence of short circuit between the electrodes and defect of the element can be prevented in the above-mentioned various functional elements. This is very preferable.

In order to enhance an adhesive force to the transparent conductive layer, an easy-adhesion treatment, specifically a plasma treatment, a corona discharge treatment, or a short wavelength ultraviolet light irradiation can be previously given to the above base film.

The conductive oxide microparticles applied to the coating liquid for forming the transparent conductive layer used in the present invention are the conductive oxide microparticles composed mainly of any one or more of indium oxide, tin oxide, and zinc oxide, and includes, for example, indium tin oxide (ITO) microparticles, indium zinc oxide (IZO) microparticles, indium-tungsten oxide (IWO) microparticles, indium titanium oxide (ITiO) microparticles, indium zirconium oxide microparticles, tin antimony oxide (ATO) microparticles, fluorine tin oxide (FTO) microparticles, aluminium zinc oxide (AZO) microparticles, and gallium zinc oxide (GZO) microparticles, but is not limited thereto as long as it comprises the transparency and the conductivity. Among the above, ITO has the highest property and is preferable.

An average particle diameter of the conductive oxide microparticles used in the present invention is preferably 1 to 500 nm and more preferably 5 to 100 nm. When the average particle diameter is less than 1 nm, it becomes difficult to produce the coating liquid for forming the transparent conductive layer, and the resistance value of the resulting transparent conductive layer becomes high. Meanwhile, when it exceeds 500 nm, the conductive oxide microparticles are easily sedimented in the coating liquid for forming the transparent conductive layer, and the handling thereof becomes not easy. Simultaneously, it becomes difficult that the high transmittance and the low resistance value are achieved simultaneously in the transparent conductive layer. The average particle diameter of the above conductive oxide microparticles indicates the value observed under a transmission electron microscope (TEM).

Here, the binder component in the coating liquid for forming the transparent conductive layer has the action to bind the conductive oxide microparticles one another to enhance the conductivity and the strength of the film, the action to enhance the adhesive force between the base film and the transparent conductive layer, and the action to impart the solvent resistance for preventing the deterioration of the transparent conductive layer due to the organic solvent contained in respective printing pastes used for forming the phosphor layer, the dielectric layer and the rear electrode layer in the process for producing the dispersion-type EL element. As the binder, it is possible to use the organic and/or inorganic binders, and the binder can be appropriately selected to play the above actions in consideration of the base film to which the coating liquid for forming the transparent conductive layer is applied, and film forming condition of the transparent conductive layer.

As the organic binder used in the present invention, it is not impossible to apply the thermoplastic resins such as acryl resins and polyester resins, but generally it is preferable to have the solvent resistance. Therefore, it is necessary to be the crosslinkable resins, and it is possible to select from thermosetting resins, curable resins at ambient temperature (cold-setting resins), curable resins with the ultraviolet light (uv-curable resins) and curable resins with electron beam (EB-curable resins). For example, the thermosetting resins include epoxy resins and fluorine resins, the cold-setting resins include two-pack epoxy resins and urethane resins, the UV-curable resins include resins containing various oligomers, monomers and a photo initiator, and the EB-curable resins include resins containing various oligomers and monomers, but the organic binders are not limited to these resins.

The inorganic binder used in the present invention can include binders composed mainly of silica sol, alumina sol, zirconia sol, and titania sol. For example, as the above silica sol, polymers obtained by adding water and an acid catalyst to tetra-alkyl silicate to hydrolyze and further to perform a dehydropolycondensation, or polymers obtained by hydrolyzing a commercially available alkyl silicate solution which is already allowed to polymerize to a tetramer or pentamer and further performing the dehydropolycondensation can be utilized.

If the dehydropolycondensation progresses excessively, the viscosity in the solution is increased and the solution is finally solidified. A degree of the dehydropolycondensation is controlled to the upper limit viscosity or below at which the solution can be applied on a transparent substrate (base film). But, the degree of the dehydropolycondensation is not particularly limited as long as the viscosity is equivalent to or lower than the above upper limit viscosity, but considering the film strength and weather resistance, a weight average molecular weight is preferably about 500 to 50,000. This alkyl silicate hydrolysis polymer (silica sol) nearly completes the dehydropolycondensation reaction (crosslinking reaction) to become a rigid silicate binder matrix (binder matrix composed mainly of silicon oxide) upon heating after applying and drying the coating liquid for forming the transparent conductive layer. The above dehydropolycondensation reaction starts immediately after drying the film, and the conductive oxide microparticles are firmly fixed one another not to migrate with time. Thus, when the inorganic binder is used, the above-mentioned compression treatment after applying and drying the coating liquid for forming the transparent conductive layer needs to be performed as rapidly as possible.

As the binder used in the present invention, an organic-inorganic hybrid binder can also be used. For example, binders obtained by partially modifying the above silica sol with an organic functional group, and binders composed mainly of various coupling agents such as silicon coupling agents are included.

The transparent conductive layer using the inorganic binder or the organic-inorganic hybrid binder used in the present invention necessarily has the excellent solvent resistance, but it is necessary to appropriately select the binder not to deteriorate the adhesive force to the base film and the flexibility of the transparent conductive layer.

A ratio of the conductive oxide microparticles to the binder component in the coating liquid for forming the transparent conductive layer used in the present invention is 85:15 to 97:3 and preferably 87:13 to 95:5 as a weight ratio of the conductive oxide microparticles to the binder component, if specific gravity values of the conductive oxide microparticle and the binder component are supposed to be about 7.2 (specific gravity of ITO) and about 1.2 (specific gravity of the ordinary organic resin binder), respectively. For the reason, when the rolling treatment of the present invention is performed, if the amount of the binder component is larger than the ratio of 85:15, the resistance of the transparent conductive layer becomes too high. Conversely when the amount of the binder component is smaller than the ratio of 97:3, the strength of the transparent conductive layer is reduced, and simultaneously the sufficient adhesive force to the base film is not obtained.

Subsequently, the method for producing the coating liquid for forming the transparent conductive layer used in the present invention will be described. First, the conductive oxide microparticles are mixed with the solvent and if necessary with a dispersant, and then a dispersion treatment is given to obtain a dispersion of the conductive oxide microparticles. The dispersant includes various coupling agents such as silicon coupling agents, various polymeric dispersants, and anionic, nonionic and cationic surfactants. The dispersant can be appropriately selected depending on the type of the conductive oxide microparticles used and the method for the dispersion treatment. Even if no dispersant is used, a good dispersion state can be sometimes obtained depending on the combination of the conductive oxide microparticles and the solvent applied, and the method for the dispersion. Since it is likely that the use of the dispersant deteriorates the resistance value and weather resistance of the film, coating liquid for forming the transparent conductive layer without using the dispersant is the most preferable. As the dispersion treatment, the common methods such as a sonication, a homogenizer, a paint shaker, and a bead mill can be applied.

The coating liquid for forming the transparent conductive layer is obtained by adding the binder component to the resulting dispersion of the conductive oxide microparticles, and adjusting the concentration of conductive oxide microparticles and a composition of the solvents. Here, the binder component was added to the dispersion of the conductive oxide microparticles, but may be added previously before the dispersion step of the conductive oxide microparticles, and it is not particularly restricted. The concentration of the conductive oxide microparticles may be appropriately set depending on the coating method used.

The solvent used for the coating liquid for forming the transparent conductive layer used in the present invention is not particularly limited, and can be appropriately selected depending on the coating method, a film forming condition and the material of the base film. Examples of the solvent include, but are not limited to, water, alcohol solvents such as methanol (MA), ethanol (EA), 1-propanol (NPA), isopropanol (IPA), butanol, pentanol, benzyl alcohol and diacetone alcohol (DAA); ketone solvents such as acetone, methyl ethyl ketone (MEK), methyl propyl ketone, methyl isobutyl ketone (MIBK), cyclohexane and isophorone; ester solvents such as ethyl acetate, butyl acetate and methyl lactate; glycol derivatives such as ethylene glycol monomethyl ether (MCS), ethylene glycol monoethyl ether (ECS), ethylene glycol isopropyl ether (IPC), propylene glycol methyl ether (PGM), propylene glycol ethyl ether (PE), propylene glycol methyl ether acetate (PGM-AC), propylene glycol ethyl ether acetate (PE-AC), diethylene glycol monomethyl ether, diethylene glycol monoethyl ether, diethylene glycol monobutyl ether, diethylene glycol monomethyl ether acetate, diethylene glycol monoethyl ether acetate, diethylene glycol monobutyl ether acetate, diethylene glycol dimethyl ether, diethylene glycol diethyl ether, diethylene glycol dibutyl ether, dipropylene glycol monomethyl ether, dipropylene glycol monoethyl ether and dipropylene glycol monobutyl ether; benzene derivatives such as toluene, xylene, mesitylene and dodecylbenzene; formamide (FA), N-methylformamide, dimethylformamide (DMF), dimethylacetamide, dimethylsulfoxide (DMSO), N-methyl-2-pyrrolidone (NMP), γ-butylolactone, ethylene glycol, diethylene glycol, tetrahydrofuran (THF) and chloroform.

Subsequently, the method for producing the flexible dispersion-type EL element of the present invention will be described. The coating liquid for forming the transparent conductive layer is applied onto the base film lined with the support film by the method such as a screen printing, a blade coating, a wire-bar coating, a spray coating, a roll coating or a gravure coating, and dried to form the coating layer. Then the above-mentioned compression treatment is given thereto. It is preferable that the compression treatment is performed by the rolling treatment using the metal rolls. Subsequently, the coating layer to which the compression treatment is given is subject to the curing treatment such as a heating treatment (dry cure, heat cure) or an ultraviolet light irradiation (cure with ultraviolet light) depending on the type of the coating liquid to make the transparent conductive layer.

A full printing (solid) or a pattern printing may be given to the transparent conductive layer. Since the thickness of the transparent conductive layer is normally about 1 μm and is thinner compared with the thickness (70 to 230 μm) of those including the support film, the low adhesive layer (several to about 20 μm) and the base film, even in the pattern printing, it is possible to evenly apply the pressure upon compression treatment regardless of the presence or absence of the formation of the transparent conductive layer. The pattern on the transparent conductive layer may be formed by photo patterning in which a photoresist is formed by applying onto the transparent conductive layer to which the full printing (solid) is given, exposed and developed, and then etched with an iron chloride based or aqua regia based acid. The transparent conductive layer of the present invention comprises the conductive oxide microparticles and the binder matrix, and by the above etching, the binder portion is not removed but the conductive oxide microparticles are dissolved and removed. Thus, an etched portion can be changed to being insulative.

And, it is common that the phosphor layer, the dielectric layer and the rear electrode layer are sequentially formed on the above transparent conductive layer by the screen printing, and normally, the pastes for coating (printing)/forming respective layers of the phosphor layer, the dielectric layer and the rear electrode layer are sequentially applied (printed) and heated/cured (normally at 120 to 140° C.). Commercially available pastes can be used as these pastes. A phosphor layer paste and a dielectric layer paste are obtained by dispersing phosphor particles (zinc sulfide based microparticles) and dielectric particles (barium titanate based microparticles) in the solvent containing the binder composed mainly of a high dielectric component of fluorine rubber. A rear electrode layer paste is obtained by dispersing conductive microparticles such as carbon microparticles in the solvent containing a thermosetting resin binder.

Here, when the respective layers such as phosphor layer are screen-printed on the transparent conductive layer, generally the method of using the suction stage having many holes with small diameters and fixing the film by reducing pressure in the portion of the holes is used. If the base film is thin, the film in the portion of the holes is deformed and hollowed due to reduced pressure and traces of these hollows are left on the film after the screen printing. However, as described above, in the present invention, the support film having the sufficient strength is used upon screen printing and that film is delaminated and removed after forming the dispersion-type EL element. Thus, the above problem can be avoided.

Major parts of the dispersion-type EL element are composed of the above transparent conductive layer, the phosphor layer, the dielectric layer and the rear electrode layer, but in the actual dispersion-type EL element, a collector electrode (made of a silver paste) of the transparent conductor layer, a lead electrode (made of a silver paste) of the rear electrode layer, and an insulating protection coating (made of an insulation paste) for preventing short circuit between the electrodes and electric shock are further formed.

Also in the method for producing the flexible functional element selected from any of the liquid crystal display element, the organic EL element, and the electronic paper element, as is the case with the method for producing the above flexible dispersion-type EL element, the above each functional element is formed on the transparent conductive layer of the film with the transparent conductive layer, and subsequently the support film having the low adhesive layer is delaminated and removed at the interface between the base film and the low adhesive layer.

In the various flexible functional elements such as flexible dispersion-type EL elements according to the present invention, the base film has a thin thickness and is flexible. Thus, they are excellent in flexibility. Among them, the flexible dispersion-type EL element can be applied as the luminescent element incorporated into the key input parts of the device such as mobile phones, remote controllers, and mobile information terminals.

EXAMPLES

Examples of the present invention will be specifically described but the present invention is not limited to these examples. In the text, "%" denotes "% by weight" except for "%" of transmittance and haze value, and a "part" denotes "part by weight".

Example 1

36 g of granular ITO microparticles having an average particle diameter of 0.03 μm (brand name: SUFP-HX made by Sumitomo Metal Mining Co., Ltd.) were mixed with 24 g of methyl isobutyl ketone (MIBK) and 36 g of cyclohexanone as the solvents, a dispersion treatment was given thereto, and subsequently 3.8 g of urethane acrylate based ultraviolet light curable resin binder and 0.2 g of a photo initiator (Dalocure 1173) were added and stirred well to yield a coating liquid for forming a transparent conductive layer in which the ITO microparticles having the dispersed average particle diameter of 130 nm were dispersed.

First, prior to producing a film with a transparent conductive layer, a heating shrinkage treatment (150° C.×15 minutes, tension free) was given to a base film (PET: thickness of 6 μm) lined with a support film (PET: thickness of 75 μm) via a heat resistant silicone low adhesive layer. Subsequently, the coating liquid for forming the transparent conductive layer was wire-bar-coated (wire diameter: 0.15 mm) on the base film, dried at 60° C. for one minute, then a rolling treatment (linear pressure: 200 kgf/cm=196 N/mm; nip width: 0.9 mm) was given thereto using metal rolls having the diameter of 100 mm and plated with hard chromium, and further a binder component was cured (in nitrogen, UV-intensity: 100 mW/cm$^2$×2 seconds) using a high pressure mercury lamp to form the transparent conductive layer (film thickness: about 1.0 μm) composed of the ITO microparticles and the binder, which were densely filled on a base film, to yield the film with the transparent conductive layer according to Example 1, composed of the support film, the base film and the transparent conductive layer. The base film is extremely thin and flexible whose thickness is 6 μm, and PET is highly transparent. Thus, an absorption of visible light due to providing the base film is extremely small. A peel strength between the support film and the base film in the above film with the transparent conductive layer was 2.4 g/cm. Here, the above peel strength is a T type peel strength (T type peel was given to the base film at tensile speed of 300 mm/min). A dimensional change rate (thermal shrinkage rate) upon heating was 0.05%. Here, as the dimensional change rate (thermal shrinkage rate), the dimensional change rate (thermal shrinkage rate) in a machine direction (MD) in which the value was larger is shown in the dimensional change rates (thermal shrinkage rates) in the machine direction (MD) and a transverse direction (TD) of the film obtained by heating (150° C.×30 minutes) the film with the transparent conductive layer according to Example 1.

For film properties of the above transparent conductive layer, a visible light transmittance was 90.9%, a haze value was 3.1% and a surface resistivity was 500Ω/☐ (ohms per square). The surface resistivity was measured on the day after the formation of the transparent conductive layer because it tended to temporarily reduce immediately after curing by being affected with the ultraviolet light irradiation upon curing of the binder.

The above transmittance and the haze value are the values for the transparent conductive layer alone, and are calculated from the following calculation formulae 1 and 2, respectively.

Transmittance of Transparent conductive layer (%)=
[(Transmittance measured for Transparent conductive layer and Base film lined with support film)/(Transmittance measured for Base film lined with support film)]×100     [Calculation formula 1]

Haze value of Transparent conductive layer (%)=[(Haze value measured for Transparent conductive layer and Base film lined with support film)−(Haze value measured for Base film lined with support film)]     [Calculation formula 2]

The surface resistivity of the transparent conductive layer was measured using a surface resistance mater LORESTA AP (MCP-T400) made by Mitsubishi Chemical Corporation. The haze value and the visible light transmittance were measured using a haze mater (HR-200) made by Murakami Color Research Laboratory.

Subsequently, a phosphor paste (7154 made by DuPont) in which zinc sulfide particle which was the phosphor was dispersed in a resin solution composed mainly of a fluorine polymer was screen-printed in a size of 4×5 cm on the transparent conductive layer of the above film with the transparent conductive layer using a 200 mesh polyester screen, and dried at 120° C. for 30 minutes to form a phosphor layer.

A dielectric paste (7153 made by DuPont) in which barium titanate particles were dispersed in the resin solution composed mainly of the fluorine polymer was screen-printed in a size of 4×5 cm on the above phosphor layer using the 200 mesh polyester screen and was dried at 120° C. for 30 minutes, and this process was repeated twice to form a dielectric layer.

A carbon conductive paste (FEC-198 made by Fujikura Kasei Co., Ltd) was screen-printed in a size of 3.5×4.5 cm on the above dielectric layer using the 200 mesh polyester screen and was dried at 130° C. for 30 minutes to form a rear electrode layer.

An Ag lead wire for applying the voltage was formed using a silver conductive paste on one end of the above transparent conductive layer and rear electrode layer, and the support film was delaminated to yield a flexible dispersion-type EL element according to Example 1 (base film, transparent conductive layer, phosphor layer, dielectric layer, and rear electrode layer). In order to prevent the short circuit between the electrodes and the electric shock, an insulation layer as an insulating protection coating of the transparent conductive layer and the rear electrode layer was formed as needed using an insulation paste (XB-101G made by Fujikura Kasei Co., Ltd), but this does not relate to an essence of the present invention, and thus its detail is omitted.

In the process for producing the above flexible dispersion-type EL element, the base film could be easily delaminated at the interface with the support film. The peel strength between the support film and the base film was 3.1 g/cm. When the voltage at 100 V and 400 Hz was applied between the lead wires for applying the voltage to this flexible dispersion-type EL element, the dispersion-type EL element emitted the light uniformly and its luminance was 52 Cd/cm$^2$. The luminance was measured using a luminance meter (brand name: BM-9 made by Topcon).

Example 2

The flexible dispersion-type EL element according to Example 2 was obtained in the same way as in Example 1, except that the coating liquid for forming the transparent conductive layer was wire-bar-coated (wire diameter: 0.075 mm) to form the transparent conductive layer (film thickness: about 0.5 μm) composed of the ITO microparticles and the binder, which were densely filled on the base film lined with the support film, to yield the film with the transparent conductive layer according to Example 2, having the peel strength of 2.4 g/cm between the support film and the base film, the dimensional change rate (thermal shrinkage rate) of 0.05% upon heating, the visible light transmittance of 95.1%, the haze value of 1.4% and the surface resistivity of 1500Ω/□ (ohms per square).

In the process for producing the above flexible dispersion-type EL element, the base film could be easily delaminated at the interface with the support film. The peel strength between the support film and the base film was 3.0 g/cm. When the voltage at 100 V and 400 Hz was applied between the lead wires for applying the voltage to this flexible dispersion-type EL element, the dispersion-type EL element emitted the light uniformly and its luminance was 53 Cd/cm².

Example 3

The film with the transparent conductive layer according to Example 3, having the peel strength of 2.3 g/cm between the support film and the base film, the dimensional change rate (thermal shrinkage rate) of 0.06% upon heating, the visible light transmittance of 95.0%, the haze value of 1.6% and the surface resistivity of 1500Ω/□ (ohms per square) was obtained in the same way as in Example 2, except that the heating shrinkage treatment (150° C.×15 minutes, tension free) was given to the base film (PET: thickness of 12 μm) lined with the support film (PET: thickness of 125 μm) via the heat resistant silicone low adhesive layer. The flexible dispersion-type EL element according to Example 3 was obtained in the same way as in Example 2, except for using this film with the transparent conductive layer.

In the process for producing the above flexible dispersion-type EL element, the base film could be easily delaminated at the interface with the support film. The peel strength between the support film and the base film was 3.2 g/cm. When the voltage at 100 V and 400 Hz was applied between the lead wires for applying the voltage to this flexible dispersion-type EL element, the dispersion-type EL element emitted the light uniformly and its luminance was 53 Cd/cm².

Example 4

The film with the transparent conductive layer according to Example 4, having the peel strength of 2.4 g/cm between the support film and the base film, the dimensional change rate (thermal shrinkage rate) of 0.06% upon heating, the visible light transmittance of 95.0%, the haze value of 1.6% and the surface resistivity of 1500Ω/□ (ohms per square) was obtained in the same way as in Example 2, except that the heating shrinkage treatment (150° C.×15 minutes, tension free) was given to the base film (PET: thickness of 16 μm) lined with the support film (PET: thickness of 100 μm) via the heat resistant silicone low adhesive layer. The flexible dispersion-type EL element according to Example 4 was obtained in the same way as in Example 2, except for using this film with the transparent conductive layer.

In the process for producing the above flexible dispersion-type EL element, the base film could be easily delaminated at the interface with the support film. The peel strength between the support film and the base film was 3.1 g/cm. When the voltage at 100 V and 400 Hz was applied between the lead wires for applying the voltage to this flexible dispersion-type EL element, the dispersion-type EL element emitted the light uniformly and its luminance was 53 Cd/cm².

Comparative Example 1

The transparent conductive layer (film thickness: 1.3 μm) composed of the ITO microparticles and the binder, which were not densely filled, was formed on the PET film without performing the rolling treatment (linear pressure: 200 kgf/cm=196 N/mm) in the process for forming the transparent conductive layer in Example 1 to yield the film with the transparent conductive layer according to Comparative Example 1. The peel strength between the support film and the base film was 2.4 g/cm. The dimensional change rate (thermal shrinkage rate) upon heating was 0.05%.

For the film properties of this transparent conductive layer, the visible light transmittance was 84.3%, the haze value was 16.1% and the surface resistivity was 20 KΩ/□ (kilo-ohms per square). The surface resistivity was measured on the day after the formation of the transparent conductive layer because it tended to temporarily reduce immediately after curing by being affected with the ultraviolet light irradiation upon curing of the binder.

The flexible dispersion-type EL element according to Comparative Example 1 was obtained in the same way as in Example 1, except for using the base film on which the above transparent conductive layer was formed.

In the process for producing the above flexible dispersion-type EL element, the base film could be easily delaminated at the interface with the support film. The peel strength between the support film and the base film was 3.1 g/cm. When the voltage at 100 V and 400 Hz was applied between the lead wires for applying the voltage to this flexible dispersion-type EL element, the dispersion-type EL element emitted the light unevenly, and portions having the luminance of about 30 Cd/cm² which was extremely low were observed.

Comparative Example 2

The transparent conductive layer (film thickness: 1.0 μm) composed of the ITO microparticles and the binder, which were densely filled, was formed on the base film to yield the film with the transparent conductive layer according to Comparative Example 2 in the same way as in Example 1, except that the base film was not lined with the support film and a low heat shrinkage treatment type PET film having the thickness of 100 μm and obtained by giving the easy-adhesion treatment to the base film by corona discharge was used. The dimensional change rate (thermal shrinkage rate) upon heating was 0.4%. The transparent conductive layer had the visible light transmittance of 91.3%, the haze value of 2.8% and the surface resistivity of 525Ω/□ (ohms per square). The dispersion-type EL element according to Comparative Example 2 (PET film, transparent conductive layer, phosphor layer, dielectric layer, and rear electrode layer) was obtained in the same way as in Example 1.

When the voltage at 100 V and 400 Hz was applied between the lead wires for applying the voltage to this dispersion-type EL element, the dispersion-type EL element emitted the light uniformly and its luminance was 52 Cd/cm².

Comparative Example 3

The dispersion-type EL element according to Comparative Example 3 (PET film, sputtering ITO layer, phosphor layer, dielectric layer, and rear electrode layer) was obtained in the same way as in Comparative Example 2, except that in place of the PET film having the transparent conductive layer composed of the ITO microparticles and the binder, which were densely filled, in Comparative Example 2, a commercially available sputtered ITO film (visible light transmittance: 92.0%, haze value: 0%, surface resistivity: 100Ω/□ (ohms per square) in which the ITO layer was formed on the PET film (base film) having the thickness of 125 μm by sputtering method was used. The dimensional change rate (thermal shrinkage rate) of the above sputtered ITO film upon heating was 0.3%.

When the voltage at 100 V and 400 Hz was applied between the lead wires for applying the voltage to this dispersion-type EL element, the dispersion-type EL element emitted the light uniformly and its luminance was 55 Cd/cm$^2$.

The above transmittance and the haze value of the sputtered ITO film are the value for the ITO layer alone, and are calculated from the following calculation formulae 1 and 2, respectively.

Transmittance of ITO layer (%)=[(Transmittance measured for Base film on which ITO layer is formed)/(Transmittance measured for Base film)]×100     [Calculation formula 1]

Haze value of ITO layer (%)=[(Haze value measured for Base film on which ITO layer is formed)− (Haze value measured for Base film)]     [Calculation formula 2]

[Evaluation for Flexibility of Dispersion-Type EL Element]

The flexible dispersion-type EL element (from which the support film was delaminated) according to each Example or the dispersion-type EL element according to each Comparative Example was winded once to a bar having the diameter of 3 mm so that a light emission side was internal and external, subsequently the voltage of 100 V and 400 Hz was applied between the lead wires for applying the voltage to the dispersion-type EL element, and a luminescent state of the element was observed. In each Example, no change was observed in the luminescent state. In Comparative Example 2, it was difficult to wind the element around the bar having the diameter of 3 mm probably because the PET film as the substrate (base film) was thick which was 100 μm, and when it was forcedly winded, a part of the element was delaminated and the luminescence became uneven. In Comparative Example 3, cracks occurred in the sputtered ITO layer, and most of parts did not emit the light. Comparative Example 1 was not evaluated because its luminescence was originally uneven.

[Evaluation for Keying Durability of Dispersion-Type EL Element]

A keying durability was evaluated using a keying tester for the flexible dispersion-type EL element (from which the support film was delaminated) according to each Example or the dispersion-type EL element according to each Comparative Example. Specifically, as the voltage of 100 V and 400 Hz was applied between the lead wires for applying the voltage to the dispersion-type EL element to observe the luminescent state, the keying test with a load of 300 g was performed, and the deterioration of the luminescent state was visually observed and evaluated. In each Example and Comparative Example 2, no change was observed in the luminescent state after keying 2 million times. In Comparative Example 3, the cracks and delamination occurred in the sputtered ITO layer after keying one million times, and a keying section did not emit the light. Comparative Example 1 was not evaluated because its luminescence was originally uneven.

[Evaluation for Solvent Resistance of Dispersion-Type EL Element]

In each Example, the transparent conductive layer was formed on the base film lined with the support film, subsequently, the side of the transparent conductive layer was rubbed reciprocally 10 times with an acetone-impregnated cotton swab and the change in appearance was observed, but no change was observed. The flexible dispersion-type EL element was made using this evaluated transparent conductive layer, and the voltage of 100 V and 400 Hz was applied between the lead wires for applying the voltage to observe the luminescent state. Consequently, the luminescence including the portion rubbed with the cotton swab was uniform and no effect due to acetone was observed.

[Evaluation for Click Feeling of Dispersion-Type EL Element]

The flexible dispersion-type EL element according to each Example or the dispersion-type EL element according to each Comparative Example was attached on a dome contact switch for a mobile phone, and a click feeling was evaluated. The good click feeling was obtained for Examples 1 to 4, but the sufficient click feeling was not obtained for Comparative Examples 2 and 3.

Example 5

A coating liquid for forming a hole injection layer was spin-coated (150 rpm, 100 seconds) on the transparent conductive layer of the film with the transparent conductive layer composed of the support film, the base film, and the transparent conductive layer obtained in Example 1, and heated at 120° C. for 10 minutes to form the hole injection layer. A coating liquid for forming a polymer luminescent layer was further spin-coated (150 rpm, 60 seconds) on the above hole injection layer, and heated in vacuum at 80° C. for 60 minutes to form the polymer luminescent layer.

The above coating liquid for forming the hole injection layer was the solution containing a polyethylene dioxythiophene (PEDOT:PSS) dispersion (Baytron P-VP-CH8000 made by Bayer) to which polystyrene sulfonic acid was doped and the binder, and specifically contained 20.0% Baytron P-VP-CH8000, 1.0% γ-glycidoxypropyl trimethoxysilane, 1.5% N-methyl-2-pyrrolidone, 5.0% PGM and 72.5% isopropyl alcohol (IPA).

The above coating liquid for forming the polymer luminescent layer was the solution containing a poly-p-phenylene vinyl (PPV) based polymer as a polymer light-emitting material, and specifically contained 0.25% poly[2-methoxy-5-(3', 7'-dimethyloctyloxy)-1,4-phenylenevinylene) and 99.75% toluene.

Calcium (Ca) and silver (Ag) were deposited in vacuum in this order on the above polymer luminescent layer to form a cathode electrode layer of a bilayer composed of Ca and Ag, further a gas barrier coating layer is formed and then the support film was delaminated and removed to obtain a flexible organic EL element (base film, transparent conductive layer (anode electrode layer), hole injection layer, polymer luminescent layer, cathode electrode layer, and gas barrier coating layer) according to Example 5. Primarily, the gas barrier coating layer should be formed on one side or both sides of the base film in order to prevent the penetration of moisture and oxygen from the base film side, but the formation thereof is omitted in the present invention.

In the process for producing the above flexible dispersion-type EL element, the base film could be easily delaminated at the interface with the support film. The peel strength between the support film and the base film was 2.7 g/cm. When the direct current voltage of 15 V was applied between the transparent conductive layer (anode electrode layer) and the cathode electrode layer (anode: plus, cathode: minus) of the resulting flexible organic EL element, the uniform luminescence with orange color could be identified.

[Evaluation of Flexible Functional Element]

The flexible organic EL element according to Example 5 of the present invention is extremely excellent in flexibility because the base film is thin, and because the film with the transparent conductive layer having the extremely smooth transparent conductive layer to which the rolling treatment was given was used, there was no electric short (short-circuit) due to a protrusion of the transparent conductive layer (anode electrode layer) upon application of the direct current voltage and the stable luminescence could be identified. Also, because the base film is lined with the support film although the very thin base film having the thickness of 6 μm is used, the uniform coating layer was formed in the process for producing the organic EL element, and thus, the uniform luminescence was identified.

EXPLANATIONS OF LETTERS OR NUMERALS

1 Transparent plastic film
2 Transparent conductive layer
3 Phosphor layer
4 Dielectric layer
5 Rear electrode layer
6 Collector electrode
7 Insulating protection layer
8 Support film
9 Base film

What is claimed is:

1. A compressed multilayered film for use with a flexible functional element which comprises, in sequence:
   a support film,
   a low adhesion layer,
   a base film, and
   a transparent conductive layer,
   said support film being separable from said base film, said base film having a thickness of 3 to 25 μm, and said transparent conductive layer comprising mainly conductive oxide microparticles and a binder matrix.

2. The compressed multilayered film according to claim 1, wherein a peel strength between the low adhesive layer and the base film is 1 to 15 g/cm.

3. The compressed multilayered film according to claim 1, wherein dimensional change rates in both a machine direction and a transverse direction are 0.3% or less.

4. The compressed multilayered film according to claim 1, wherein a thickness of the base film is 3 to 9 μm.

5. The compressed multilayered film according to claim 1, wherein the conductive oxide microparticles are selected from the group consisting of indium oxide, tin oxide, and zinc oxide.

6. The compressed multilayered film according to claim 1, wherein the conductive oxide microparticles consist of indium tin oxide.

7. The compressed multilayered film according to claim 1, wherein the binder matrix is crosslinked and has an organic solvent resistance.

8. The compressed multilayered film according to claim 1, wherein the compressed multilayered film element is compressed by a rolling treatment using metal rolls.

9. A method for producing a film with a transparent conductive layer comprising the sequential steps of
   (a) providing base film having a thickness of 3 to 25 μm and lined with a support film having a low adhesive layer separable at an interface with the base film,
   (b) coating a side of the base film not lined with the support film using a coating liquid for forming the transparent conductive layer composed mainly of conductive oxide microparticles, a binder, and a solvent,
   (c) compressing the base film on which the coating layer is formed and the lining support film, and
   (d) curing the coating layer to form the transparent conductive layer.

10. The method for producing the film with the transparent conductive layer according to claim 9, wherein in step (b) the base film with coating layer is passed between metal rolls.

11. The method for producing the film with the transparent conductive layer according to claim 10, wherein the metal rolls provide a linear pressure of 29.4 to 490 N/mm (30 to 500 kgf/cm).

12. A method for producing a flexible functional element, wherein a functional element which is selected from any of a liquid crystal display element, an organic electroluminescent element, and an electronic paper element is formed on a transparent conductive layer of the film with the transparent conductive layer according to claim 11, and subsequently the support film having a low adhesive layer is delaminated and removed at an interface between the base film and the low adhesive layer.

13. A method for producing a flexible dispersion-type electroluminescent element, wherein at least a phosphor layer, a dielectric layer, and a rear electrode layer are sequentially formed on a transparent conductive layer of the film with the transparent conductive layer according to claim 11, and subsequently the support film having a low adhesive layer is delaminated and removed at an interface between the base film and the low adhesive layer.

14. The compressed multilayered film according to claim 1, wherein said base film is selected from the group consisting of polyethylene terephthalate, polyethylene naphtha late, nylon, polyether sulfone, polycarbonate, polyethylene, polypropylene, urethane and fluorine-based resins.

15. The compressed multilayered film according to claim 1, wherein said low adhesion layer comprises an acrylic- or silicone-containing layer.

* * * * *